United States Patent
Williamson et al.

(10) Patent No.: US 10,748,863 B2
(45) Date of Patent: Aug. 18, 2020

(54) SEMICONDUCTOR DEVICES HAVING METAL POSTS FOR STRESS RELIEF AT FLATNESS DISCONTINUITIES

(71) Applicant: TEXAS INSTRUMENTS INCORPORATED, Dallas, TX (US)

(72) Inventors: Jaimal Mallory Williamson, McKinney, TX (US); Guangxu Li, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 14 days.

(21) Appl. No.: 15/835,197

(22) Filed: Dec. 7, 2017

(65) Prior Publication Data

US 2018/0190606 A1    Jul. 5, 2018

Related U.S. Application Data

(60) Provisional application No. 62/441,152, filed on Dec. 30, 2016.

(51) Int. Cl.
| | | |
|---|---|---|
| *H01L 23/00* | (2006.01) | |
| *H01L 23/31* | (2006.01) | |
| *H01L 23/29* | (2006.01) | |

(52) U.S. Cl.
CPC ............ *H01L 24/13* (2013.01); *H01L 23/293* (2013.01); *H01L 23/3121* (2013.01); *H01L 23/3157* (2013.01); *H01L 23/562* (2013.01); *H01L 24/03* (2013.01); *H01L 24/05* (2013.01); *H01L 24/11* (2013.01); *H01L 24/16* (2013.01); *H01L 2224/03013* (2013.01); *H01L 2224/03019* (2013.01); *H01L 2224/0345* (2013.01); *H01L 2224/0346* (2013.01); *H01L 2224/0362* (2013.01); *H01L 2224/0381* (2013.01); *H01L 2224/0401* (2013.01); *H01L 2224/05147* (2013.01); *H01L 2224/1146* (2013.01); *H01L 2224/13012* (2013.01); *H01L 2224/13013* (2013.01); *H01L 2224/13014* (2013.01); *H01L 2224/13017* (2013.01);
(Continued)

(58) Field of Classification Search
CPC .............. H01L 23/293; H01L 23/3121; H01L 23/3157; H01L 23/562; H01L 24/03; H01L 24/05; H01L 24/11; H01L 24/13; H01L 24/16
See application file for complete search history.

(56) References Cited

U.S. PATENT DOCUMENTS 5,854,514 A *  12/1998  Roldan ................... H01L 24/83
                                               257/746
6,559,390 B1 *  5/2003  Tanaka .................. H01L 21/563
                                               174/260
(Continued)

*Primary Examiner* — Peniel M Gumedzoe
(74) *Attorney, Agent, or Firm* — Dawn Jos; Charles A. Brill; Frank D. Cimino

(57) ABSTRACT

A semiconductor device includes a first body having a first coefficient of thermal expansion (CTE) and a first surface, a third body having a third CTE and a third surface facing the first surface, and a fourth surface at an angle with respect to the third surface defining an edge of the third body, and a second body having a second CTE higher than the first and the third CTE, the second body contacting the first and the third surfaces. A post having a fourth CTE lower than the second CTE, transects the second body and contacts the edge.

21 Claims, 7 Drawing Sheets

(52) U.S. Cl.
    CPC ............ *H01L 2224/13022* (2013.01); *H01L 2224/13147* (2013.01); *H01L 2224/16225* (2013.01); *H01L 2224/16245* (2013.01); *H01L 2924/07025* (2013.01); *H01L 2924/14* (2013.01); *H01L 2924/3512* (2013.01)

(56) References Cited

U.S. PATENT DOCUMENTS

| | | | |
|---|---|---|---|
| 8,508,043 B2 * | 8/2013 | Daubenspeck | H01L 24/06 257/737 |
| 2001/0018229 A1 * | 8/2001 | Kato | H01L 21/56 438/106 |
| 2007/0069394 A1 * | 3/2007 | Bachman | H01L 24/03 257/780 |
| 2009/0032909 A1 * | 2/2009 | Brofman | H01L 21/563 257/635 |
| 2011/0193224 A1 * | 8/2011 | Ito | H01L 23/3157 257/737 |
| 2012/0313234 A1 * | 12/2012 | Shen | H01L 24/11 257/677 |
| 2015/0170887 A1 * | 6/2015 | Yuan | B23K 20/002 204/298.13 |
| 2016/0225729 A1 * | 8/2016 | Chen | H01L 24/05 |
| 2017/0084558 A1 * | 3/2017 | Seo | H01L 24/08 |

* cited by examiner

SEMICONDUCTOR DEVICES HAVING METAL POSTS FOR STRESS RELIEF AT FLATNESS DISCONTINUITIES

CROSS REFERENCE

This application claims the benefit of Provisional Application No. 62/441,152, filed Dec. 30, 2016, the entirely of which is hereby incorporated by reference.

FIELD

This disclosure is related in general to the field of semiconductor devices and processes, and more specifically to the structure and fabrication method of packaged semiconductor devices having solder bumps protected by barriers blocking moisture ingress and relieving stress.

DESCRIPTION OF RELATED ART

Among the plastic-encapsulated Quad Flat No-Lead (QFN) packages for semiconductor devices, the family of HotRod™ packages has recently emerged to high popularity, because they are thermally enhanced and thus especially suitable for high power devices. A HotRod package uses a metallic leadframe designed with power buses and thick copper leads and solder lands; the semiconductor chip terminals are connected to the leadframe by solder balls, or bumps, instead of by wire bonds. The solder bump connection of the chip is conventionally referred to as flip chip assembly. The leadframe construction results in a cost effective advanced molded package that improves electrical and thermal performance over traditional leaded packages. In addition, the elimination of wire bonds between chip terminals and leads improves application efficiency by minimizing electrical parasitics. The package size is determined by the encapsulated chip size and the number of signal pins.

In addition to the flip chip assembly of the chip inside the package, the outer terminals of the semiconductor package are attached to pads of a substrate, or board, by arrays of solder bumps. For these device connections as well as for the chip connections inside the package, it has been known since the introduction of the flip chip assembly technique that the solder connections may come under severe thermomechanical stress due to the large differences of coefficients of thermal expansion (CTE) between semiconductor device materials such as silicon, metal leads and metal pads, and plastic materials, such as packages and substrates.

Reliability of the solder connections may be tested by subjecting the assembled semiconductor devices to temperature cycles, where the assembled packages are subjected to rapid temperature swings between −55° C. and +125° C. It has been shown that these temperature swings subject the assemblies to both compressive and tensile stresses and may lead to metal fatigue and micro-cracks at the joints. The micro-cracks, in turn, can be severely aggravated by the presence of moisture.

Moisture-induced failures of plastic packaged semiconductor devices have been observed and investigated for many years. Plastic packages made, for instance, by epoxy-based molding compounds can be penetrated by discrete water molecules within a time period of about one day. This penetration does not lead to a problematic situation, however, as long as there is good adhesion inside the package between the plastic compound and the device components (semiconductor chip, metallic leadframe, substrate, etc.), and the penetrated water molecules cannot accumulate to form films of water on free surfaces.

In contrast, when some interfacial delamination has happened and water films have been able to form, quick rises of temperature may vaporize the water and initiate expansive internal pressures between the components and the package material. The expansive pressure may be high enough to bulge the package material at thin spots and eventually cause a crack through the material of the package. As an example, the temperature may rise quickly beyond the water boiling point when the packaged device is heated in order to reflow the device solder balls for attaching the device to a board. In the literature, the phenomenon of local package cracking by steam pressure has been dubbed popcorn effect. With the observed device failures, the popcorn effect has been a frustrating reliability problem for many years.

A variety of methods have been tried to prevent device delamination and package cracking by enhancing adhesion between the different device components (package compound, semiconductor chip, substrate, leadframe, etc.). Among the efforts have been chemically purifying the molding compounds; activating leadframe metal surfaces, for instance by plasma, just prior to the molding process; enhancing the affinity of leadframe metals to polymeric compounds by oxidizing the base metal or by depositing special metal layers (such as rough tin); coining the leadframes for creating dimples and other three-dimensional surface features and roughness for improved interlocking of the package material with the surfaces of the enclosed parts. However, the success of all these efforts has only been partial and limited.

SUMMARY

One embodiment discloses a semiconductor device. The semiconductor device includes a first body having a first coefficient of thermal expansion (CTE) and a first surface, a third body having a third CTE and a third surface facing the first surface, and a fourth surface at an angle with respect to the third surface defining an edge of the third body, and a second body having a second CTE higher than the first and the third CTE, the second body contacting the first and the third surfaces. A post having a fourth CTE lower than the second CTE, transects the second body and contacts the edge.

Another embodiment discloses a semiconductor device. The semiconductor device includes a semiconductor chip having an integrated circuit topped by a metal layer and the metal of the layer has a first coefficient of thermal expansion (CTE). A polymeric layer is on the metal layer and the polymeric layer has a window with sidewalls. The window exposes a surface of the metal layer. The polymeric layer has a second CTE higher than the first CTE. The semiconductor device includes a metal bump having a neck and a bulk with the neck touching the window sidewalls and contacting the surface of the metal layer. The bulk extends on the surface parallel to the metal layer up to an edge. The metal of the bump has a third CTE lower than the second CTE. A post transects the polymeric layer at the edge. The post contacts the edge and the metal layer. The metal of the post has a fourth CTE lower than the second CTE.

Yet another embodiment discloses a method for fabricating a semiconductor device. A polyimide layer is deposited on a metal layer of a semiconductor chip. Then, a first window is opened in the polyimide layer to expose the metal layer. A post is formed in the window and then a metal bump is formed that aligns with the post on edges of the metal bump.

DETAILED DESCRIPTION OF THE EMBODIMENTS

Analyzing semiconductor devices which failed in highly accelerated stress tests including exposures to moisture as well as to temperature cycles and electrical bias, revealed that in the overwhelming majority of failures the root causes were cracks in layers made of polymeric compounds or of adjacent layers of metals, causing electrical shorts.

Statistically, the majority of cracks were found at device locations where the neighboring surfaces of component parts were discontinued or drastically altered. Such discontinuities included necks of bumps, which narrowed the bump attachment to other parts, and protrusions and peaks from otherwise smooth two-dimensional and three-dimensional surfaces.

Modeling of thermomechanical stress during test and operating conditions demonstrated that the two-dimensional and three-dimensional discontinuities caused a concentration of thermomechanical stress into narrow areas and volumes. While elastic and plastic material characteristics are often able to tolerate uniform stress distribution or low amounts of stress concentration, long-lasting exposures or concentration maxima likely exceed the tolerance limits of materials characteristics, and initiate micro-cracks.

The problem of micro-cracks occurring in high stress regions of a body with a high coefficient of thermal expansion confined by bodies with lower CTE, is solved by transecting the body of high CTE with a sturdy post at locations, where one of the surfaces exhibits a discontinuity of surface. The methodology has been confirmed by data and modeling of thermomechanical stress in semiconductor devices under test and operational conditions.

As an example of semiconductor technology, many types of devices have an integrated circuit chip topped by a copper layer with a first CTE, which is protected by a polyimide layer of uniform thickness; the polyimide has a second CTE higher than the first CTE. The polyimide layer has a surface parallel to the copper layer and a window with sidewalls so that the window exposes the surface of the copper layer. In order to connect the semiconductor chip to a substrate, the window of the polyimide layer is coordinated with a copper bump (same CTE as the first CTE), which has a neck and a bulk. The neck touches the window sidewalls and contacts the surface of the copper layer in the window; in addition, the bulk extends on the surface of the polyimide layer parallel to the copper layer up to an edge, where the bulk discontinuously angles away from the polyimide layer.

It is at the location of the bump edge, where thermomechanical stress is concentrated during tests and operations. In order to inhibit the occurrence of a micro-crack in the polyimide layer, a copper post (same CTE as the first CTE) of cylindrical or cubic shape transects the polyimide layer at the edge of the bump, and contacts the bump edge and the copper layer.

Figure 1A:
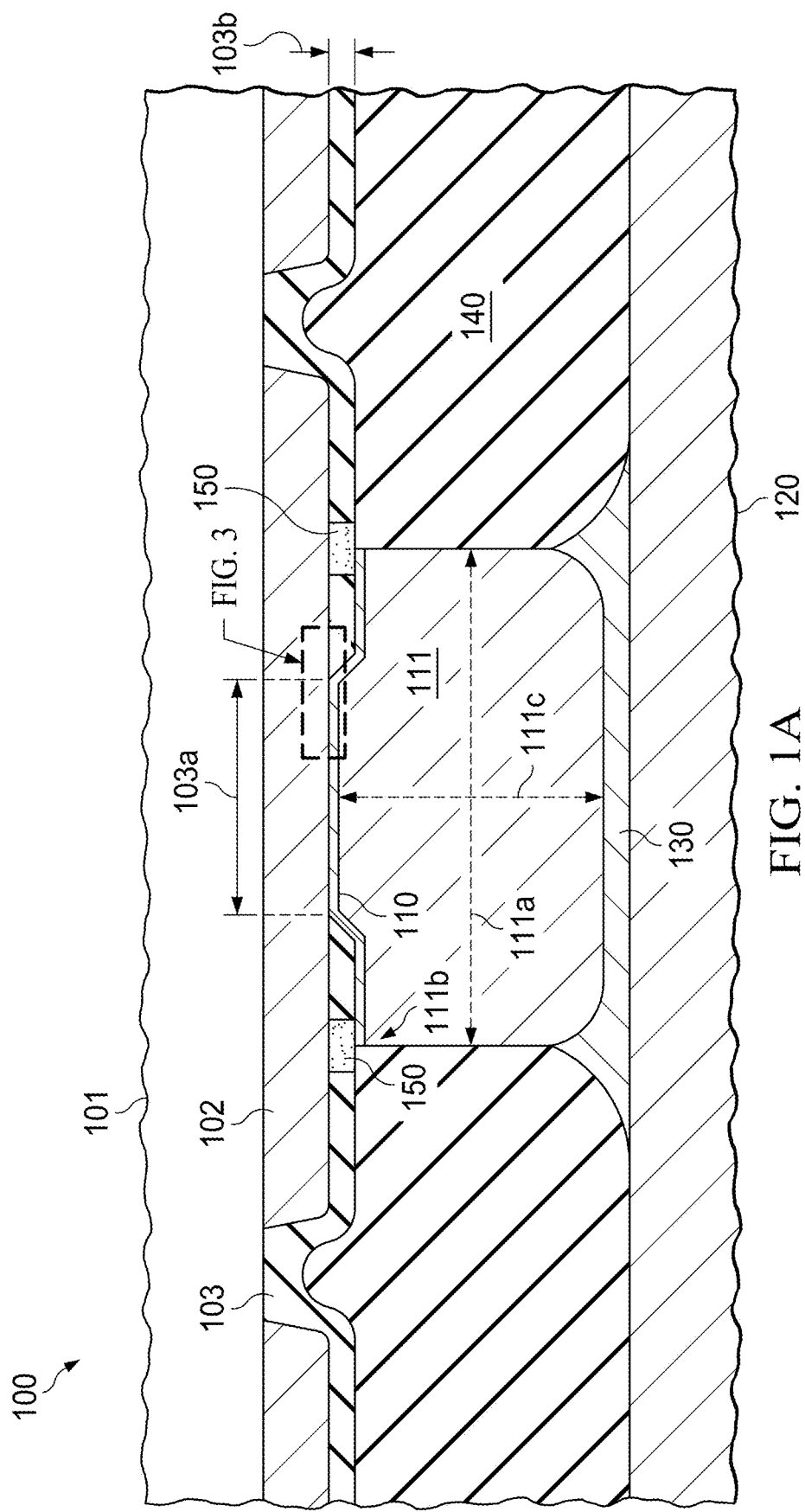
FIG. 1A is a cross section of a portion of a semiconductor device having a metal bump attached to a substrate.

FIG. 1A is a composite illustration showing an exemplary embodiment of the disclosure on the left side and some examples of the problems, which the disclosed techniques and structures solve, on the right side. FIG. 1A depicts a cross section of a portion 100 of an exemplary semiconductor device attached to a substrate 120. The semiconductor device includes chip 101 commonly made of silicon and encapsulated in package 140 typically made of a polymeric material such as an epoxy-based molding compound with inorganic fillers. Substrate 120 may be, for example, a metallic leadframe, a carrier laminated of several layers of metal and insulators, or an organic substrate. With regard to the CTE of the above mentioned materials, silicon is known for its small CTE (about $2 \times 10^{-6}$ $K^{-1}$), while the CTE of substrate 120 may be larger by about an order of magnitude.

As FIG. 1A shows, on the surface of chip 101 is a metallic layer 102, which has a surface facing away from the semiconductor chip 101. Since layer 102 is preferably made of copper, it is frequently referred to as COA (Copper Over Anything) layer. It is referred to herein as first body. The surface of the COA layer, which faces away from chip 101, is referred to herein as first surface. The first surface is facing layer 103.

Layer 103 is made of a polymeric material, preferably polyimide. Layer 103 is referred to herein as second body. Layer 103 enables passivation, protection, and stress buffering of the semiconductor chip. Layer 103 follows smoothly the first surface and has a thickness 103b preferably in the range from 5 µm to 10 µm. Thickness 103b is uniform over the first surface. Polyimide has a CTE of about $33 \times 10^{-6}$ $K^{-1}$.

As FIG. 1A shows, polymeric layer 103 has a window of width 103a to allow access and contact to layer 102. A metallic layer 110 covers the area opened by window and further extends beyond the window sidewalls along the surface of polymeric layer 103 to a total width 111a. Layer 110 is made of an alloy of refractory metals such as titanium and tungsten and may have a uniform thickness of about 100 nm. It acts as a seed layer and provides good contact and adhesion to the copper layer 102 for the metal bump or pillar to be plated on layer 110. Consequently, layer 110 is frequently referred to as under-bump metal (UBM) layer.

In FIG. 1A, a bump or pillar 111 is formed on the width 111a of UBM layer 110. The bump is preferably made of copper or a copper alloy. Bump 111 together with the UBM layer 110 are referred to herein as third body. As FIG. 1A shows, the third body follows polymeric layer 103 smoothly. The third body surface which faces polymeric layer 103 is referred to herein as third surface.

Bump 111 has been deposited (see process flow below) on seed layer 110 so that it forms sidewalls about perpendicular to polymeric layer 103 at the location where layer 110 stops. Consequently, the third surface has an edge and is thus discontinuous at the location, where the sidewalls begin at an angle 111b of about 90 degree angle with the third surface. In the exemplary device of FIG. 1A, the sidewalls remain parallel to each other (at distance 111a) along most of the bump height 111c. In other devices the bump sidewalls may not stay constant. As noted, bump 111 exhibits corners 111b with UBM layer 110 and thus with polymeric layer 103. In the exemplary device of FIG. 1A, the corners are formed by bump surfaces about normal to each other; in other devices, they may form more acute or obtuse angles. In all device examples, however, the surface contours are discontinuous; they change abruptly. The metal of bump 111 is preferably copper with a CTE of approximately $16 \times 10^{-6}$ $K^{-1}$.

As FIG. 1A further shows, bump 111 is attached to substrate 120 by reflow solder 130. After chip 101 is attached and connected to substrate 120, device 100 is encapsulated in a package 140, which may comprise a polymeric encapsulation compound. The polymeric encapsulation compound may be filled with inorganic fillers to bring the high CTE of the compound closer to the low CTE of silicon.

After curing (polymerizing) the polymeric compound, the adhesion of the packaged device parts may be tested for reliability. Standardized test conditions stress the devices to confirm that device parts made of dissimilar materials remain reliably adhered to each other under operating conditions in order to exclude the possibility of delamination, electrical disruption, and moisture ingress into the packaged device with the deleterious consequences of corrosion, disintegration, and failure.

Among the standardized reliability tests is the highly accelerated stress test, wherein the packaged devices composed of parts with different CTE are first exposed to moist ambient and then to rapid temperature cycles between −55° C. and +125° C. These temperature swings subject the assemblies to both compressive and tensile stresses. The stress inflicted by temperature cycling is referred to as thermo-mechanical stress. Thermomechanical stress is a continuous stress as long as the assembled surfaces of the device parts with different CTE are continuous. Note that there is no stress singularity when the surfaces are continuous. On the other hand, modeling and experience have shown that thermomechanical stress concentrates and peaks when the parts are made of materials of different CTE and one of the parts includes a discontinuity from the surface contour—for example, where there is an abrupt change of surface topography. When the stress exceeds the mechanical strength of one of the materials tested, the stress may lead to cracks in insulator parts, and fatigue and eventual cracks at metal locations under high stress.

For devices such as the device in FIG. 1A, it has been found that high stress is focused in the triple-point volume, where bodies made of materials of different coefficients of thermal expansion meet, and further at least one body undergoes an abrupt change of topology—for example a feature such as an edge, a corner, or a peak. In FIG. 1A, the three bodies are bump 111 made of metal such as copper, layer 103 made of polymeric material such as polyimide, and package 140 made of a polymeric compound filled with inorganic fillers. Bump 111 has a pronounced edge.

Figure 2:
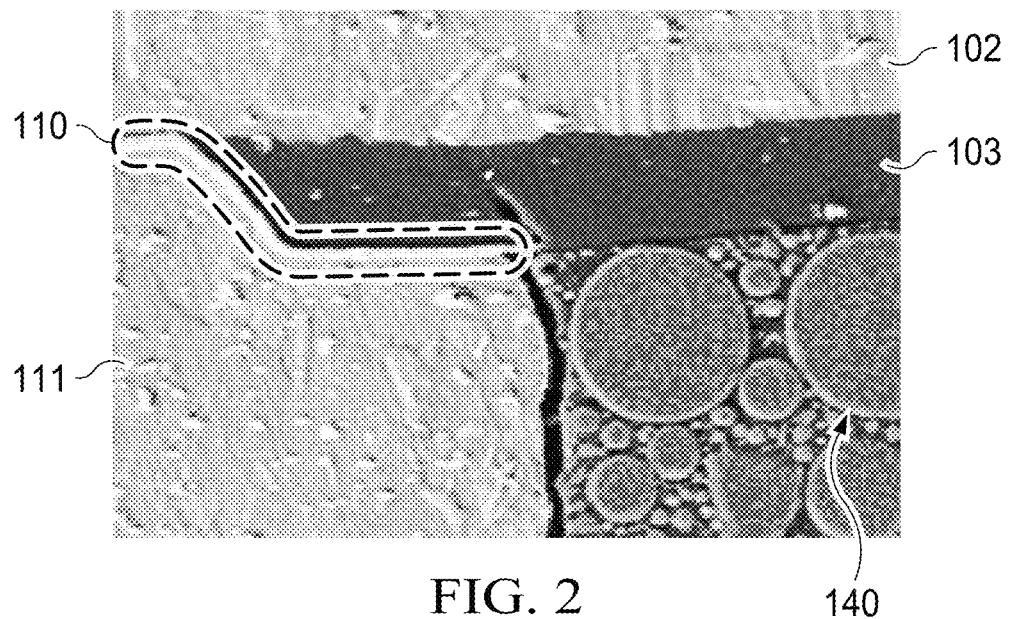
FIG. 2 shows a microphotograph of a crack through a polymeric layer caused by thermomechanical stress concentration at a location of discontinuity of surface in the device of FIG. 1A.

FIG. 2 is a cross section view showing the triple-point volume, together with the crack through the polymeric layer. In FIG. 2 the polymeric layer is polyimide, and the crack is the result of thermomechanical stress accumulated during temperature cycling tests.

Figure 3:
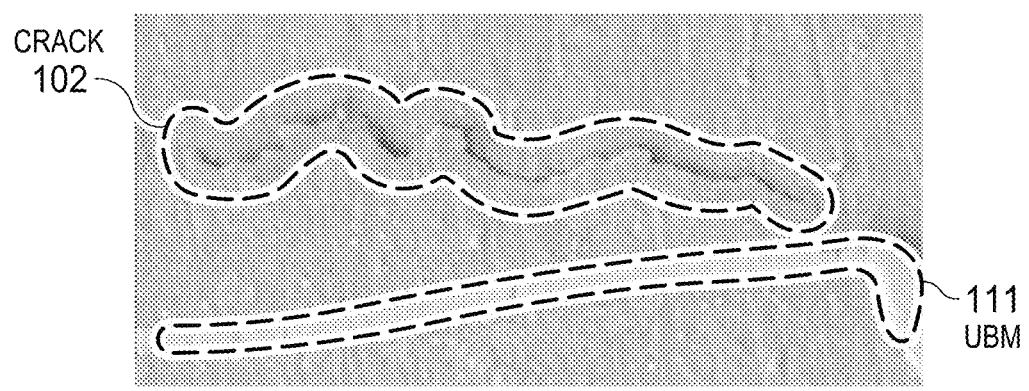
FIG. 3 shows a microphotograph of a crack through a metallic layer caused by thermomechanical stress concentration in the device of FIG. 1A.

As the microphotograph of the cross section in FIG. 2 shows, the high stress location of the bump edge may result in a crack through an insulating layer. The crack will not stop at the interface with a metal such as copper layer 102 but rather continue along the interface of polymeric layer 103 and copper layer 102 and then extend deeper into the body of layer 102. This extension is shown in the microphotograph of FIG. 3.

According to the Griffith energy-balance concept for crack formation in brittle solids, a change in the length of a nascent crack or notch cannot change the sum of all energies; in other words, the sum of surface energy and mechanical energy has to stay constant. This means for a crack extension that the surface energy may generally increase, but the mechanical energy has to decrease. The mechanical energy itself consists of the sum of the strain potential energy stored in the material and the potential energy of the outer applied loading system. This says, whenever any of these energies can assume a lower value, the freed energy can be invested in generating more surface for an expanding crack. The expanding crack can be significantly accelerated by intruding water molecules and water films. Molecules of polymeric materials for layer 103 like polyimide have a tendency to adsorb water molecules and form water films. Applying the Griffith equilibrium requirement to the semiconductor device of FIG. 1A, whenever uniform stress is applied (for instance during operation or testing of the semiconductor device) that is larger than the failure stress, a nascent crack may propagate spontaneously (see FIG. 2) and continue until it is stopped (see FIG. 3) by the end of the test or arrested by a barrier. The failure stress at the crack front, in turn, is proportional to the square root of free surface energy per unit area and to square root of Young's modulus (a material constant), and inversely proportional to the square root of length of the starter crack.

Figure 1B:
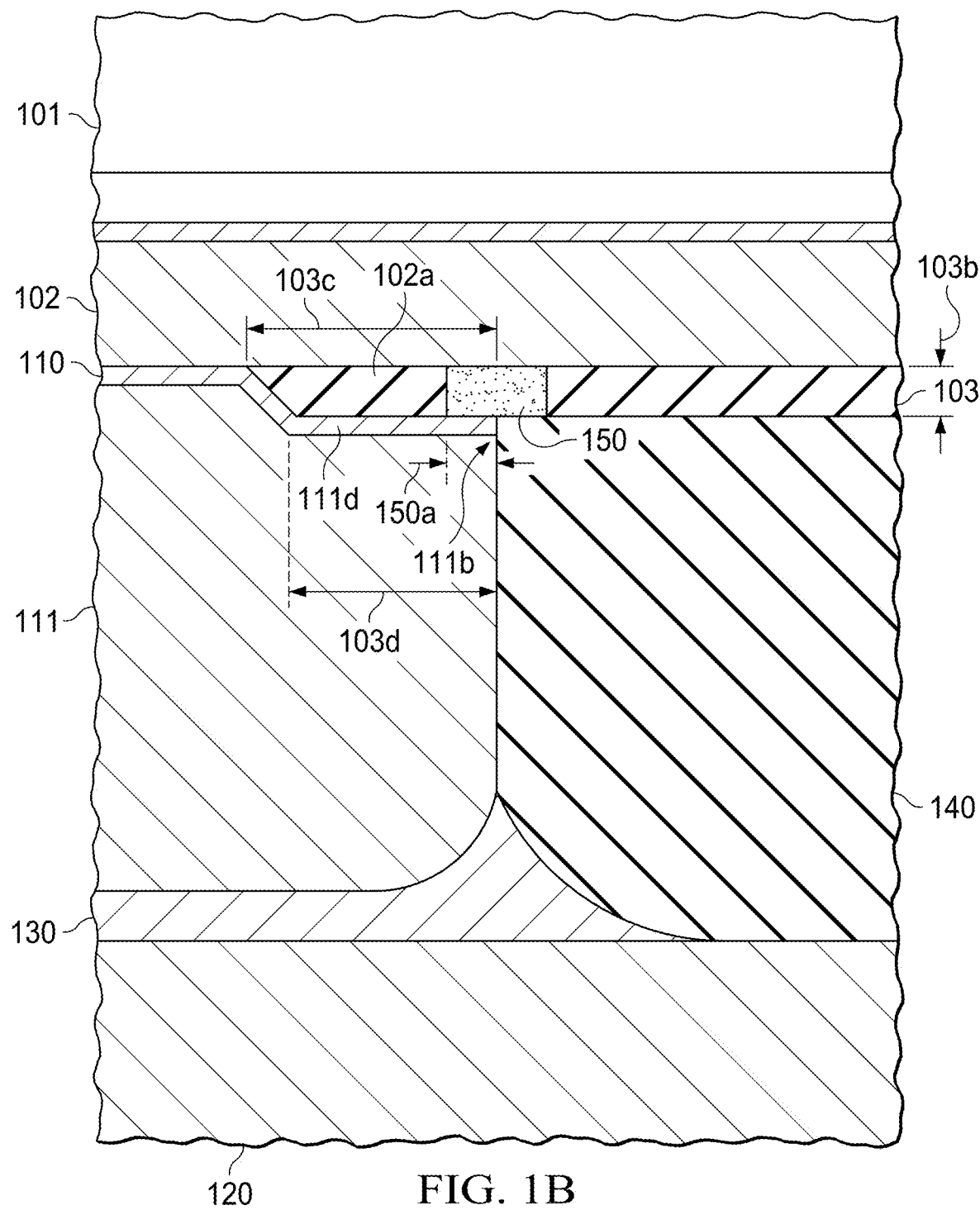
FIG. 1B is a cross section illustrating in detail the location of a post in a location of thermomechanical stress concentration.

A solution to the problems caused by stress fractures uses metallic barriers or posts. Examples of the barriers or posts 150, are illustrated in FIG. 1A and FIG. 1B. The location and size of posts 150 may be selected to concurrently reduce the starting stress, stop any nascent crack, and block any moisture ingress into a polymeric layer or body. The most effective sizes and locations for posts 150 may be determined by modeling the thermomechanical stresses inflicted on the assembly over temperature cycles of the packaged semiconductor device, or by experimental temperature cycling, such as through highly accelerated stress tests. The posts 150 are located at discontinuities of surfaces.

The cross sectional view of FIG. 1A shows a post 150 on the left side of the metal bump 111, between metallic layer 102 and the metal bump 111, which includes refractory metal layer 110. The post 150 generally encircles the portion of metal bump 111 in contact with the metallic layer 102. Viewed along an axis parallel to the arrow labeled 111c, the post would appear as a ring having an approximately circular, hexagonal, or rectangular shape, depending on the shape of the metal bump 111.

The device portion of FIG. 1A illustrates a post 150 inserted in the semiconductor device at a location, which modeling identified as a peak location for thermomechanical stress. FIG. 1B shows an analogous device location in more detail. Metal layer 102, for example a copper COA layer, has a first CTE, and a first surface 102a. Facing metal layer 102, metallic bump 111 is attached to metal layer 102 using refractory metal layer 110 for good adhesion to metal layer 102. Metallic bump 111 has a third CTE. Metallic bump 111 forms a step of height 103b and length 103c to accommodate an extension 103c of protective and stress-absorbing polymeric layer 103, which is preferably made of polyimide. Along the extension, polymeric layer is contacting the first surface 102a of metal layer 102 and metal bump surface 111d. Polymeric layer 103 may be referred to herein as second body with a second CTE. For the modeling example of FIG. 1B, height 103b is about 5 μm and length 103c is between about 8 μm and 9 μm (with the gentle onset of height 103b, length 103c is reduced to effective length 103d). Bump surface 111d is along length 103d and faces surface 102a.

The first CTE and the third CTE may be different or may be identical; they are in most cases similar since the first and the third bodies are usually metals. The second CTE, however, is in most devices greater than the first and the third CTE, since the second body is preferably a polymeric compound.

Length 103d has an abrupt discontinuity at corner 111b. The post 150 is inserted into polymeric layer 103 so that it has the same height as the layer thickness 103b and thus touches metallic layer 102. In the example of FIG. 1B, post 150 consumes a length (e.g., 5 μm) over bump 111 and another length (e.g., 5 μm) over the polymeric compound of package 140. In other devices, post 150 may be wholly over bump 111. For ease of fabrication (see below), post 150 is preferably made of metal such as copper. In other devices, post 150 is made of benzocyclobutene (BCB).

Post 150 reduces thermomechanical stress between metallic bump 111, metallic layer 102 (overlaying silicon), and polymeric package material 140. In addition, post 150 blocks adsorption of water molecules by the polymeric compound (polyimide) of layer 103 and ingress of water films towards bump 111. Experience has confirmed the absence of cracks, when semiconductor devices included posts 150 in high-stress locations.

Other embodiments are process flows for low cost fabricating posts 150 at device locations, where concentration of thermomechanical stress has to be rendered harmless. An exemplary process flow is illustrated in FIGS. 4 to 7 with continuation in FIGS. 8 to 11. Another exemplary process flow is shown in FIGS. 12 to 15 with continuation in FIGS. 8 to 11.

Figure 4:
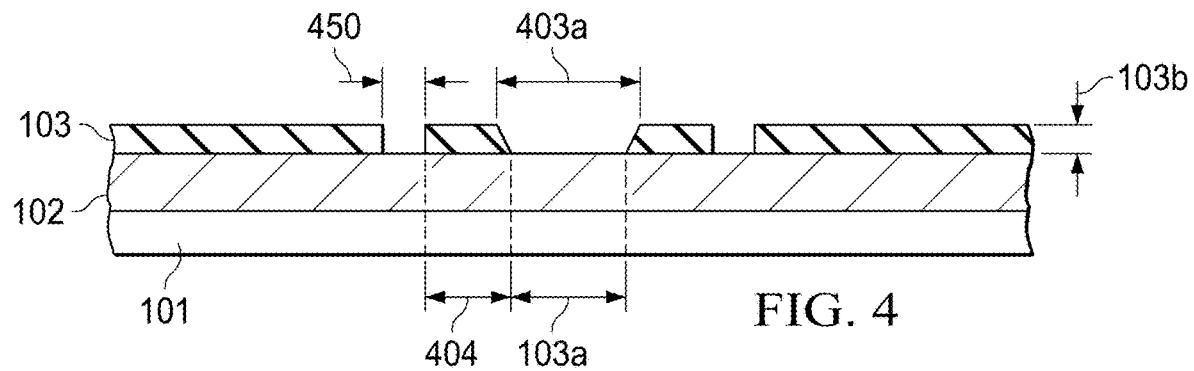
FIG. 4 depicts the step of patterning a polymeric layer on the top metal of a semiconductor device in an exemplary fabrication process flow, the pattern including windows through the polymeric layer to expose the metal surface.

Illustrated in FIG. 4, an insulating polymeric layer 103 (preferably polyimide) is deposited (preferably by a spin-on technique) on the surface of top metal layer 102 (preferably copper) positioned on silicon chip 101. Layer 103 preferably has a uniform thickness 103b between about 5 μm and 10 μm with a surface facing away from metal layer 102. Next, layer 103 is patterned by opening windows into the layer. The position and size of the windows are selected according to the device needs. In one exemplary example, a plurality of windows 450 of FIG. 4 has a length of 10 μm and the window 403a is structured so that the window 403a allows an exposure of length 103a of the surface of top metal layer 102. In an example length 103a may be about 25 μm, which is reduced from a length of 35 μm frequently found in conventional devices. Consequently, a length of 25 μm leaves a polymeric overlap 404 of about 18 μm to 19 μm instead of conventional 13 μm to 14 μm. In order to achieve the goal of stress reduction and moisture blockage in the finished device, it may be advantageous to open a multitude of windows 450 thru polymeric layer 103 in strategic locations of the device.

Figure 5:
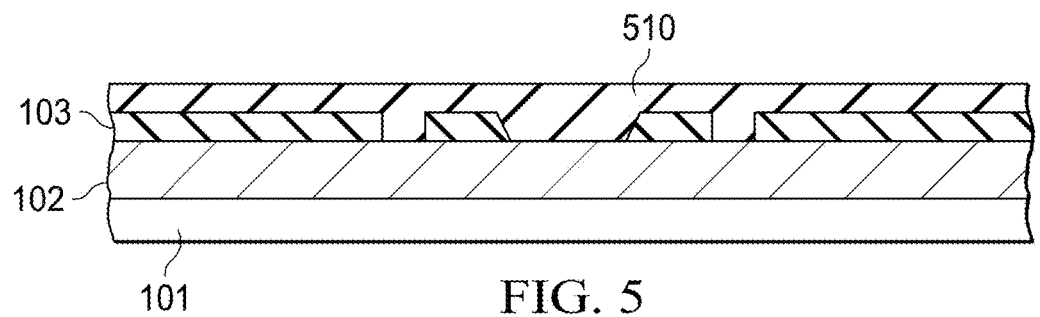
FIG. 5 illustrates the process step of spin coating the patterned polymeric layer with a photoresist layer.
Figure 6:
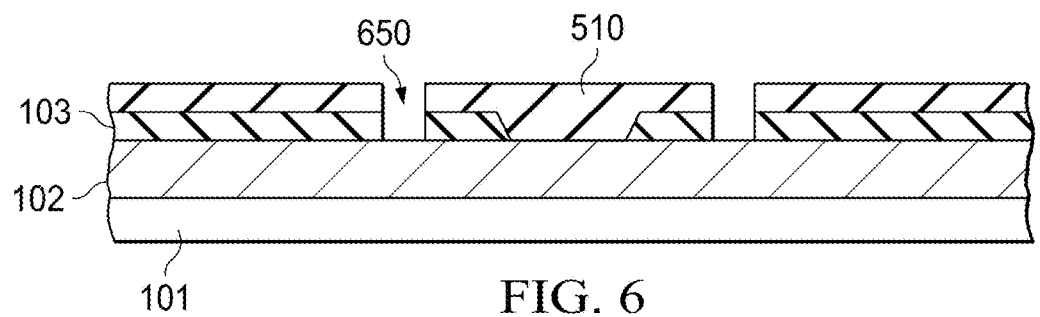
FIG. 6 shows the process step of forming openings in the photoresist layer nesting with the windows in the polymeric layer.

Illustrated in FIG. 5, photoresist material is spun on the patterned polymeric layer 103, forming layer 510. Using processes for masking, exposing, developing and etching, windows are opened in the photoresist layer 510, which are aligned with windows 450. The resulting openings are designated 650 in FIG. 6.

Figure 7:
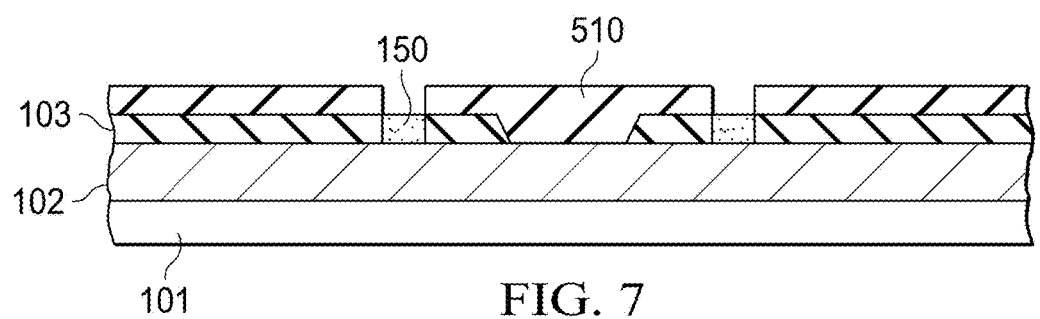
FIG. 7 depicts the step of plating a metal layer in each window of the polymeric layer according to the exemplary fabrication process flow.

Illustrated in FIG. 7, metal layers 150, preferably made of copper, are plated to a height equal to thickness 103b of polymeric layer 103. The surfaces of layers 150 and 102 are coplanar. The plated layers 150 are serving as metal (copper) posts in the finished device to relieve thermomechanical stress and to block moisture ingress. It should be mentioned that it is preferred to precede the plating process by a sputtering process to enhance adhesion of the plated post to the underlying metal. For the sputtering process, the device with the opened windows 650 is transferred to the vacuum and plasma chamber of an apparatus for sputtering metals. In the chamber and while cooled preferably below ambient temperature, the device is plasma-cleaned. The plasma accomplishes, besides cleaning the surface from adsorbed films, especially water monolayers, some roughening of the surfaces; both effects enhance the adhesion of the sputtered metal layer. Then, at uniform energy and rate, at least one layer 750 of metal is sputtered onto the exposed surface of layer 102. Preferably, the step of sputtering includes the sputtering of a first layer of a metal selected from a group including titanium, tungsten, tantalum, zirconium, chromium, molybdenum, and alloys thereof, and without delay sputtering at least one second layer of a metal selected from a group including copper, silver, gold, and alloys thereof onto the first layer. The sputtered layers serve as seed metal for the plated and thicker metal layers 150, which become operational as posts 150.

Figure 8:
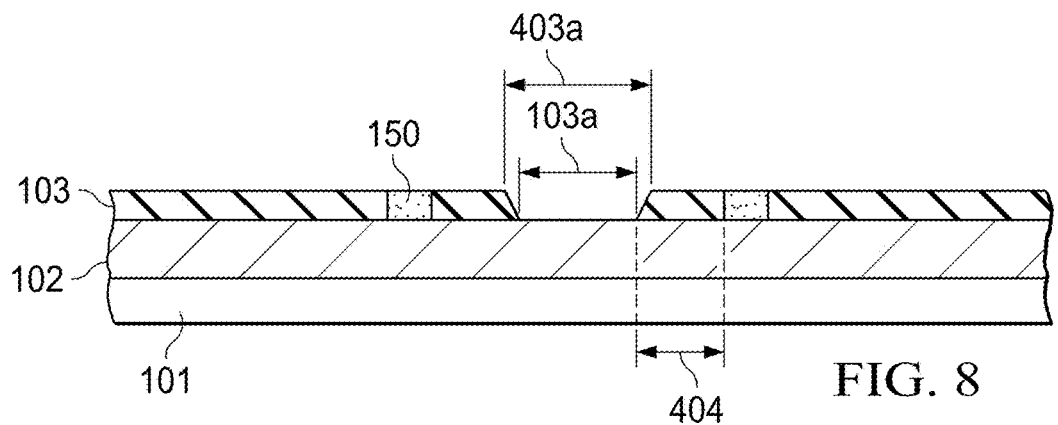
FIG. 8 illustrates the process step of removing the photoresist layer of FIG. 5, thereby exposing the top metal surface in a window of the polymeric layer.

Illustrated in FIG. 8, the photoresist layer 510 is stripped, exposing the surface of layer 102 across a length 103a. Thereafter, illustrated in FIG. 9, another photoresist layer 910 is spun on the device. A window of diameter 111a is opened through photoresist layer 910. Window 111a exposes the coplanar surfaces the copper posts 150 and the polymeric layers 103 contiguous with the posts, and the top metal layer 102 exposed across the length 103a.

Figure 10:
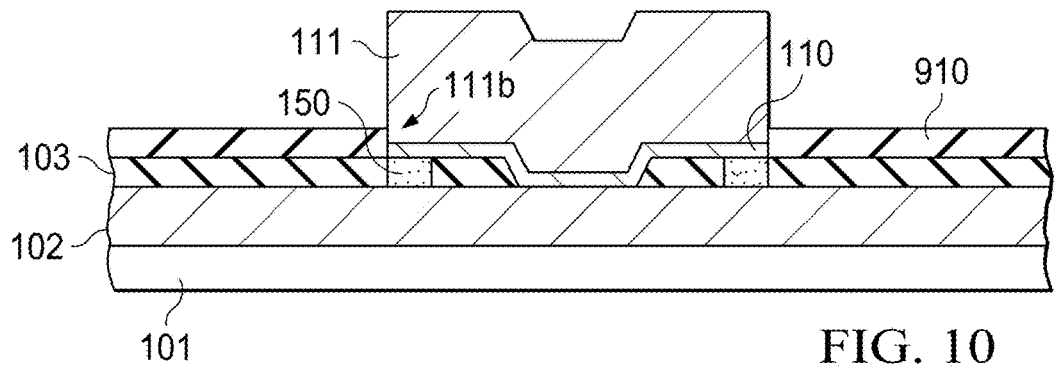
FIG. 10 depicts the steps of sputtering an adhesive under-bump metal layer across the exposed surfaces of posts, top metal, and adjoining polymeric layer, and plating a metal bump on the under-bump metal layer, according to the fabrication process flow.

Illustrated in FIG. 10, at least one metal layer 110 is sputtered onto the exposed surfaces using a technique analogous to the procedure described above. Metal layer 110 preferably includes a layer of one or more refractory metals followed by a layer of copper. Due to the plasma technique employed, metal layer 110 has good adhesion to the underlying surfaces. Layer 110 is flat on the coplanar surfaces of post 150 and adjacent portions of layer 103. After the deposition of layer 110, copper bump 111 is plated onto layer 110. Bump 111 adheres well to layer 110 and, due to metal layer 110, also to top metal layer 102. Finally, photoresist layer 910 is stripped.

Figure 11:
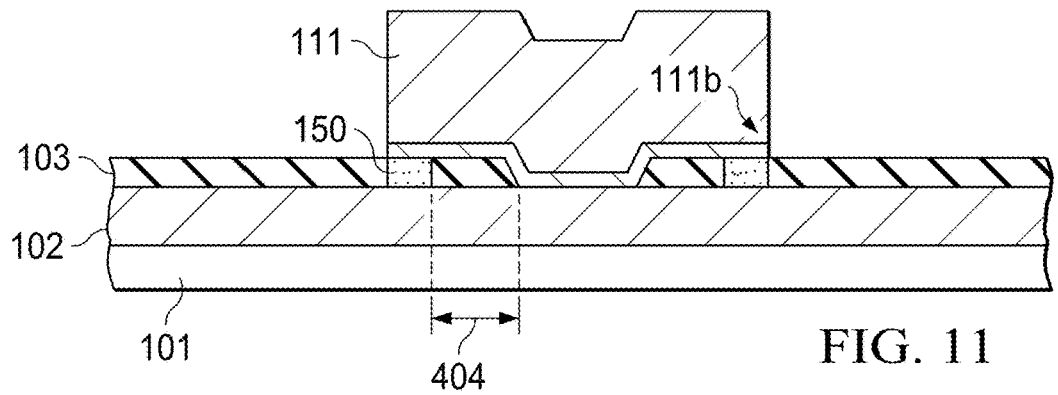
FIG. 11 illustrates the process step of stripping the photoresist layer of FIG. 9.
Figure 12:
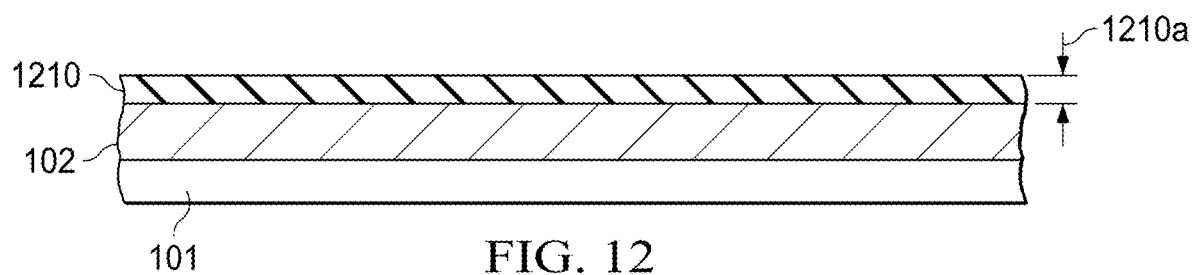
FIG. 12 shows the step of an alternative fabrication process flow, wherein a photoresist layer is spin coated on the top surface metal of a semiconductor device.

The result is illustrated in FIG. 11. Copper posts 150 are now installed to fulfill their functions of reducing thermomechanical stress at the high-stress locations of the bump edges 111b, and of blocking moisture ingress into polyimide layer 103 of overlap 404.

Another embodiment comprises a modified fabrication method for creating the posts for reducing thermomechanical stress and blocking the ingress of moisture into the packaged semiconductor device. Illustrated in FIG. 12, photoresist material is spun on the top metal layer 102 over the semiconductor (silicon) chip 101 of the device, forming layer 1210 of uniform height (referred to as first photoresist layer). The thickness of layer 1210 is selected as high as the intended height of the posts; in FIG. 12, the height of photoresist layer 1210 is designated 1210a. Preferably, height 1210a is between 5 µm and 10 µm.

Figure 13:
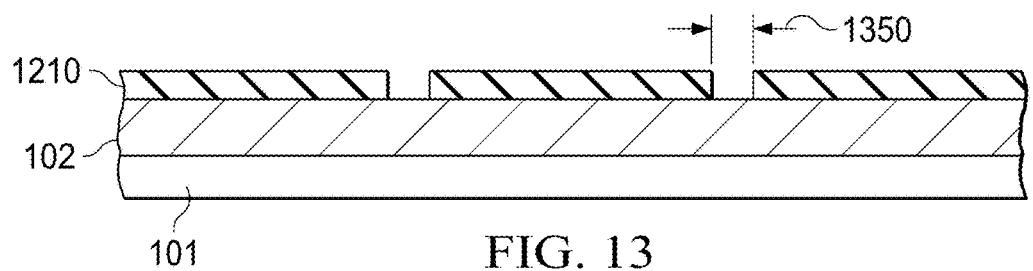
FIG. 13 depicts the step of opening windows in the photoresist layer at locations for the placing posts according to the alternative fabrication process flow.

As shown in FIG. 13, windows 1350 (referred to as first windows) are opened in photoresist layer 1210 by known processes for masking, exposing, developing, and etching in order to expose the surface of top metal layer 102. As an example, the length of windows 1350 may be 10 µm. The locations of the windows are selected to coincide with known high thermomechanical stress locations of the finished device-to-be-fabricated.

Figure 14:
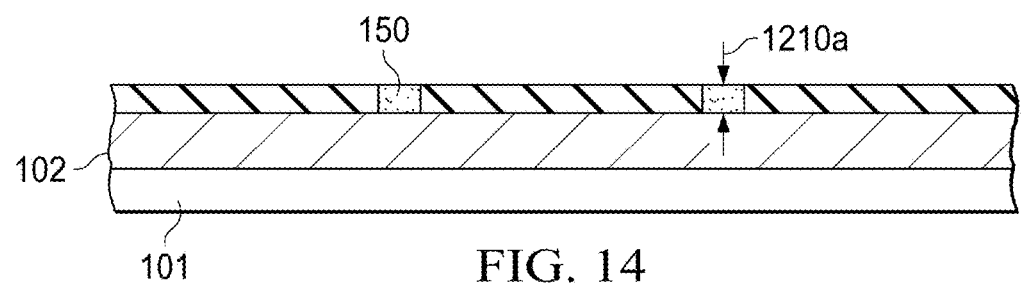
FIG. 14 illustrates the step of plating the posts in the photoresist windows according to the alternative fabrication process flow.

Illustrated in FIG. 14, using the configuration of windows 1350, metal layers 150 are plated into the windows in order to fill windows 1350 up to the height 1210a of the photoresist layer 1210 so that the plated metal can become a metal post in the finished device to relieve thermomechanical stress and to block moisture ingress. Posts 150 are preferably made of copper and serve as metallic posts in the finished device to relieve thermomechanical stress and to block moisture ingress. It should be mentioned, however, that it is preferred to precede the plating process by a sputtering process for a seed metal layer in order to enhance adhesion of the plated post to the underlying metal 102. As described above, at least one metal layer is sputtered onto the exposed surfaces of top metal layer 102; the layer preferably includes a layer of one or more refractory metals followed by a layer of copper.

Figure 15:
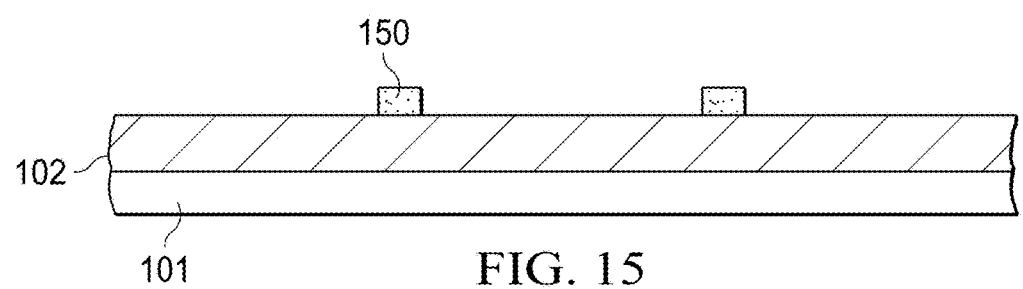
FIG. 15 shows the step of stripping the photoresist layer of FIG. 12, thereby exposing the plated posts for further processing.

As depicted in FIG. 15, photoresist layer 1210 is removed, freeing posts 150. Thereafter, as illustrated in FIG. 8, an insulating polymeric layer 103 (preferably polyimide) is deposited (preferably by a spin-on technique) on the surface of top metal layer 102 (preferably copper) positioned on silicon chip 101. Polymeric layer 103 has a thickness 103b equal to the height 1210a of posts 150 (for exemplary devices of FIG. 1A between about 5 µm and 10 µm). The surfaces of polymeric layer 103 and posts 150 are coplanar.

Next, polymeric layer 103 is patterned by opening a window 403a (referred to as second window) into the layer. The position and the size of the window are selected according to the device needs; in the exemplary device of FIG. 8, window 403a is positioned between the posts 150. Window 403a is structured so that the window 403a allows an exposure of length 103a of the surface of top metal layer 102. Length 103a may be about 25 µm, and polyimide overlap 404 between the window and post 150 may be about 18 µm to 19 µm.

Figure 9:
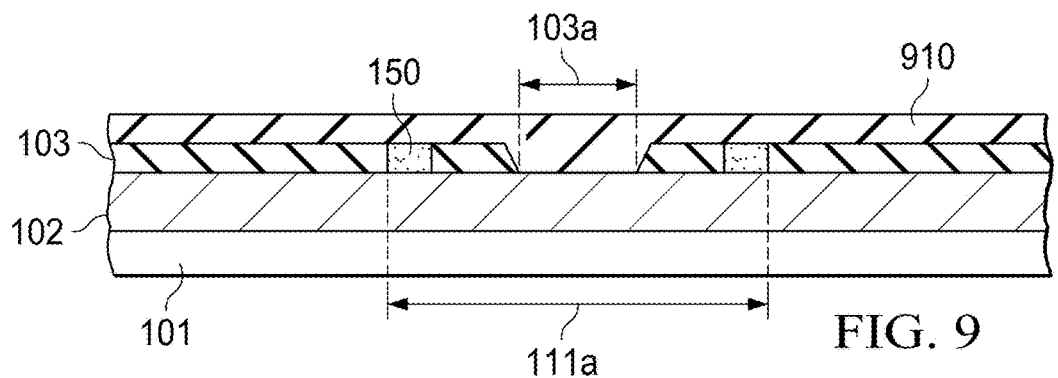
FIG. 9 shows the process step of spin coating another photoresist layer on the device surface, followed by opening a window exposing the surfaces of the top metal and the posts.

As illustrated in FIG. 9, a photoresist layer 910 (referred to as second photoresist layer) is spun on the device. Stripping the photoresist for a length 111a, a window of diameter 111a (referred to as third window) is opened through photoresist layer 910. Window 111a has a sidewall and exposes the coplanar surfaces of the copper posts 150 and the polyimide layers 103 contiguous with the posts, and the top metal layer 102 exposed by the window in polyimide layer 103.

As FIG. 10 shows, at least one metal layer 110 is sputtered onto the exposed surfaces using a technique analogous to the procedure described above. Metal layer 110 preferably includes a layer of one or more refractory metals followed by a layer of copper. Due to the plasma technique employed, metal layer 110 has good adhesion to the underlying surfaces. Layer 110 has the length 111a and is flat on the coplanar surfaces of post 150 and layer 103. After the deposition of layer 110, copper bump 111 is plated onto layer 110. Bump 111 has length 111a and adheres well to layer 110 and, due to metal layer 110, also to top metal layer 102.

Finally, photoresist layer 910 is stripped. The result is illustrated in FIG. 11. Metal bump 111 is over the coplanar posts 150 and the polymeric layer surface and has discontinuities on its surface at the bump edges 111b at the sidewalls of former window 111a (third window). Copper posts 150 are now installed to fulfill their functions of reducing thermomechanical stress at the high-stress locations of the bump edges 111b, and of blocking moisture ingress into polyimide layer 103 of overlap 404.

Figure 16:
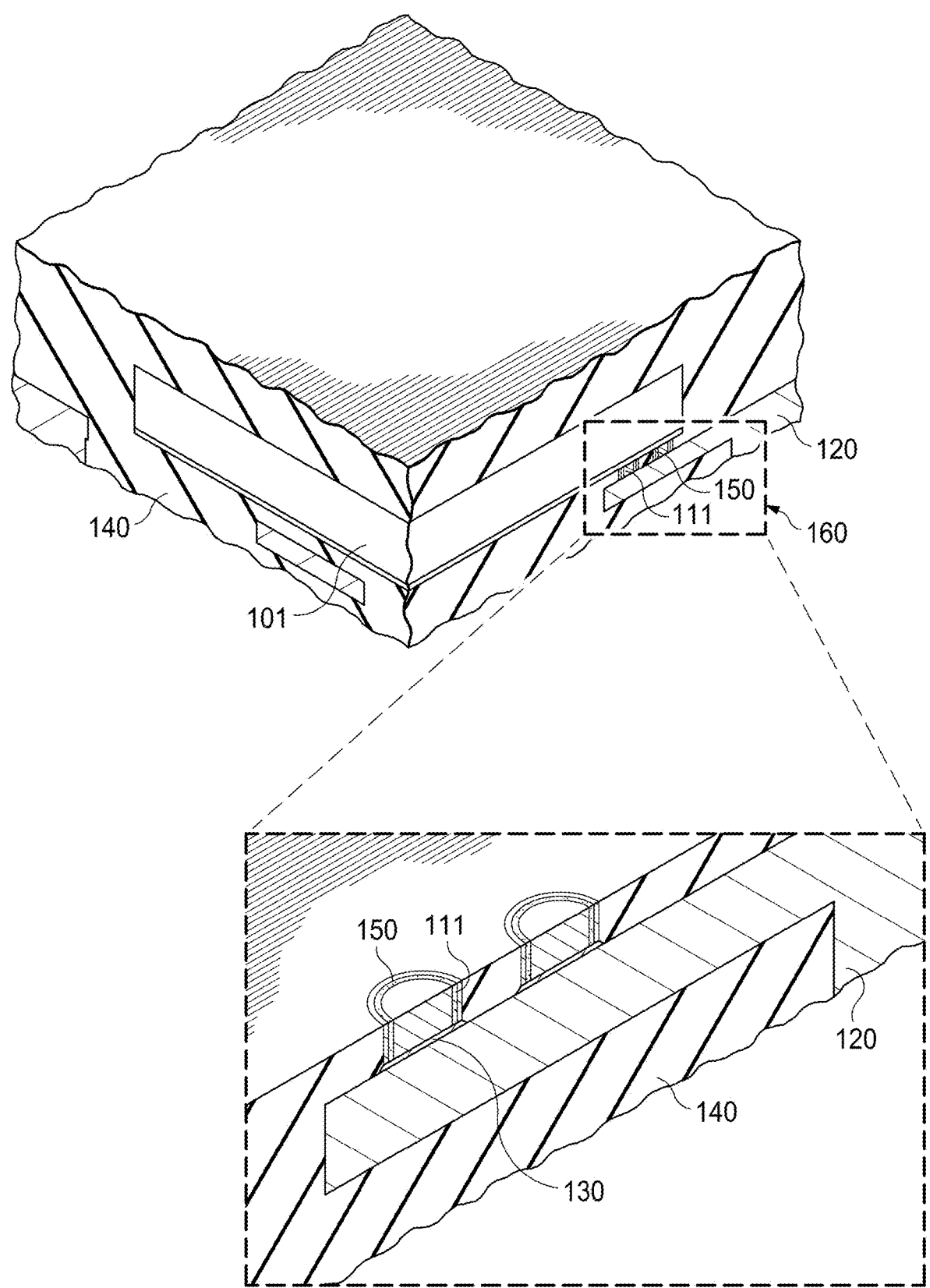
FIG. 16 shows a 3D view of a portion of the semiconductor device according to an embodiment.

FIG. 16 shows a 3D view of a portion of the semiconductor device according to an embodiment. For simplicity, only a quadrant of the semiconductor device is shown. The semiconductor device includes metal bump 111 connecting the substrate 120 to the chip 101. A magnified view of the portion 160 of the semiconductor device is shown with a top part of the encapsulation 140 removed. It can be seen that the metal bump 111 has a circular shape from a top view of the semiconductor device. The post 150 also has a ring shape from the top view of the semiconductor device.

While illustrative embodiments have been described, this description is not intended to be construed in a limiting sense. Various modifications and combinations of the illustrative embodiments, as well as other embodiments, will be apparent to persons skilled in the art upon reference to the description. As an example, these techniques and structures are intended to be applied not only to active semiconductor devices with low and high pin counts, such as transistors and integrated circuits, but also to combinations of active and passive components on a leadframe pad.

As another example, these techniques and structures are intended to be applied not only to silicon-based semiconductor devices, but also to devices using gallium arsenide, gallium nitride, silicon germanium, and any other semiconductor material employed in industry. Additionally, leadframes with cantilevered leads, quad flat no-lead (QFN) and small outline no-lead (SON) type leadframes all may be used.

As another example, these techniques and structures apply to leadframes, laminated substrates, and any other substrate or support structure, which includes a metallurgical surface configuration suitable for solder attachment.

It is therefore intended that the appended claims encompass any such modifications or embodiments.

What is claimed is:

1. A semiconductor device comprising:
a first body including a first surface;
a third body including a third surface facing the first surface, and a fourth surface at an angle with respect to the third surface defining an edge of the third body between the third surface and the fourth surface;
a second body contacting the first and the third surfaces; and
a closed structure, including a geometric plane shape, transecting the second body and directly contacting the edge, wherein a top and a bottom surface of the second body is coplanar with a top and a bottom surface of the closed structure respectively.

2. The device of claim 1 further comprising a bump contacting, and electrically connected to the third body and the closed structure.

3. The device of claim 2, wherein the bump is attached to a portion of a lead frame.

4. The device of claim 2, wherein the first body is on a semiconductor substrate.

5. The device of claim 4 further comprising a polymeric compound covering portions of the third body, second body, the bump and the semiconductor substrate.

6. The device of claim 1, wherein:
the first body includes a first coefficient of thermal expansion (CTE);
the third body includes a third CTE;
the second body includes a second CTE higher than the first CTE and the third CTE; and
the closed structure includes a fourth CTE lower than the second CTE.

7. The device of claim 6, wherein the first CTE is $16 \times 10^{-6}$ $K^{-1}$, the second CTE is $33 \times 10^{-6}$ $K^{-1}$, and the third CTE is $16 \times 10^{-6}$ $K^{-1}$.

8. The device of claim 1, wherein the closed structure has top and bottom surfaces and sides forming a shape selected from a group consisting of a circle, hexagon, and a rectangle.

9. The device of claim 1, wherein the closed structure includes a metal.

10. The device of claim 1, wherein the edge includes a corner, or a peak.

11. The device of claim 1, wherein the first body and the third body each comprise metal.

12. The device of claim 1, wherein the second body includes a polymeric material.

13. The device of claim 1, wherein the third body includes an under bump metal layer of copper or copper alloy.

14. A semiconductor device comprising:
a semiconductor substrate on a first body with a first surface;
a third body including a third surface contacting a portion of the first surface, and a fourth surface at an angle with respect to the third surface defining an edge of the third body between the third surface and the fourth surface;
a second body contacting the first and the third surfaces;
a closed structure, including a geometric plane shape, contacting the second body and contacting the edge, wherein a top and a bottom surface of the second body is coplanar with a top and a bottom surface of the closed structure respectively;
a bump contacting the third body;
a portion of a lead frame attached to the bump; and
a polymeric compound covering portions of the third body, second body, the bump, the portion of the lead frame, and the semiconductor substrate.

15. The device of claim 14, wherein:
the first body includes a first coefficient of thermal expansion (CTE);
the third body includes a third CTE;
the second body includes a second CTE higher than the first CTE and the third CTE; and
the closed structure includes a fourth CTE lower than the second CTE.

16. The device of claim 15, wherein the first CTE is $16 \times 10^{-6}$ $K^{-1}$, the second CTE is $33 \times 10^{-6}$ $K^{-1}$, and the third CTE is $16 \times 10^{-6}$ $K^{-1}$.

17. The device of claim 15, wherein the closed structure transects the second body, and wherein the closed structure is within two parallel planes along two opposite surfaces of the second body.

18. The device of claim 14, wherein the closed structure directly contacts the edge.

19. The device of claim 14, wherein the closed structure includes a circular shape from a top view of the device, and wherein the closed structure includes copper or benzocyclobutene.

20. The device of claim 14, wherein the first body and the third body each comprise metal.

21. The device of claim 14, wherein the second body includes a polymeric material.

* * * * *